(12) United States Patent
Song et al.

(10) Patent No.: US 9,713,261 B2
(45) Date of Patent: Jul. 18, 2017

(54) FABRICATION PROCESS OF STEPPED CIRCUIT BOARD

(75) Inventors: Jianyuan Song, Guangdong (CN); Weihong Peng, Guangdong (CN); Pingping Xie, Guangdong (CN); Dong Liu, Guangdong (CN)

(73) Assignee: SHENZHEN SUNTAK MULTILAYER PCB CO., LTD., Shenzhen (CN)

( * ) Notice: Subject to any disclaimer, the term of this patent is extended or adjusted under 35 U.S.C. 154(b) by 121 days.

(21) Appl. No.: 14/356,209

(22) PCT Filed: Aug. 31, 2012

(86) PCT No.: PCT/CN2012/080829
§ 371 (c)(1),
(2), (4) Date: May 5, 2014

(87) PCT Pub. No.: WO2013/097480
PCT Pub. Date: Jul. 4, 2013

(65) Prior Publication Data
US 2014/0304977 A1    Oct. 16, 2014

(30) Foreign Application Priority Data
Dec. 30, 2011    (CN) .......................... 2011 1 0454578

(51) Int. Cl.
| | |
|---|---|
| H05K 3/00 | (2006.01) |
| H05K 3/12 | (2006.01) |
| H05K 3/18 | (2006.01) |
| H05K 3/42 | (2006.01) |
| H05K 3/34 | (2006.01) |
| H05K 3/46 | (2006.01) |
| H05K 1/02 | (2006.01) |

(52) U.S. Cl.
CPC ............. *H05K 3/00* (2013.01); *H05K 3/0017* (2013.01); *H05K 3/0044* (2013.01); *H05K 3/0047* (2013.01); *H05K 3/0073* (2013.01); *H05K 3/12* (2013.01); *H05K 3/188* (2013.01); *H05K 3/3452* (2013.01); *H05K 3/42* (2013.01); *H05K 3/425* (2013.01); *H05K 3/428* (2013.01); *H05K 3/4623* (2013.01); *H05K 3/4629* (2013.01); *H05K 1/0269* (2013.01); *H05K 2201/09036* (2013.01); *H05K 2201/09845* (2013.01); *H05K 2203/0315* (2013.01); *H05K 2203/162* (2013.01); *Y10T 29/49004* (2015.01); *Y10T 29/49155* (2015.01); *Y10T 29/49156* (2015.01); *Y10T 29/49165* (2015.01); *Y10T 29/49179* (2015.01)

(58) Field of Classification Search
CPC ...... H05K 3/00; H05K 3/0017; H05K 3/0044; H05K 3/0047; H05K 3/0073; H05K 3/12; H05K 3/188; H05K 3/3452; H05K 3/42; H05K 3/425; H05K 3/428; H05K 3/4623; H05K 3/4629; H05K 1/0269; H05K 2201/09036; H05K 2201/09845; H05K 2203/162; H05K 2203/0315; Y10T 29/49155; Y10T 29/49156; Y10T 29/49165; Y10T 29/49179; Y10T 29/49004

See application file for complete search history.

(56) References Cited

U.S. PATENT DOCUMENTS

| | | | | |
|---|---|---|---|---|
| 4,706,167 A | * | 11/1987 | Sullivan ............... | H05K 3/3452 174/257 |
| 5,855,995 A | * | 1/1999 | Haq ..................... | H05K 3/4629 174/256 |
| 8,020,292 B1 | * | 9/2011 | Kumar ................. | H05K 3/4623 29/825 |
| 2005/0054548 A1 | * | 3/2005 | Myoung .......... | H05K 2203/031 510/202 |

FOREIGN PATENT DOCUMENTS

JP          2004214410 A   *   7/2004

* cited by examiner

*Primary Examiner* — A. Dexter Tugbang
(74) *Attorney, Agent, or Firm* — Jackson IPG PLLC; Demian K. Jackson

(57) ABSTRACT

A fabrication process of a stepped circuit board comprises A) cutting a circuit board substrate, printing patterns on an inner layer of the circuit board substrate, stepped groove milling of the inner layer, washer milling a washer between the inner layer and an outer layer, brownification and lamination processing on the inner layer, and then drilling holes on an outer layer of the circuit board substrate; B) electroplating the entire circuit board substrate by depositing copper on the outer layer of the circuit board substrate with drilled holes; C) performing pattern transfer by means of through-hole plating of the drilled holes on the circuit board substrate processed by the copper depositing and the electroplating; D) after pattern transferring, grinding a shape of a connecting piece (SET) on the circuit board substrate after the electroplating; E) plugging the drilled holes to form plug holes and printing a solder mask and texts in a silk-screen manner after forming the plug holes; F) depositing nickel immersion gold on the entire circuit board substrate, then printing characters in a silk-screen manner, thereby forming the stepped circuit board; and G) testing and inspecting an electric performance and appearance of the stepped circuit board to fabricate a finished product of the stepped circuit board.

5 Claims, No Drawings

FABRICATION PROCESS OF STEPPED CIRCUIT BOARD

FIELD OF THE INVENTION

The present invention belongs to the technical field of fabrication of circuit boards, particularly to a fabrication process of a stepped circuit board, widely applied in micro devices.

BACKGROUND OF THE INVENTION

The development of small-size and diversified electronics causes a great restriction in space and safety. Apparently, conventional planar circuit boards cannot meet requirements of many fields on electronics any more. Hence, multilayer or stepped circuit boards have arisen and have gradually taken the place of conventional planar circuit boards. However, for those skilled in the art, there is always a challenge to fabricate a stepped circuit board of a three-dimensional structure design. Particularly, during the fabrication of a stepped groove thereof, there will be depressions or projections, adhesive flowing or other defects. In addition, if a stepped groove is not appropriate in design, the processes, such as printing patterns on the outer layer of a circuit board, dry film laminating, drilling and solder-masking, will be more difficult.

SUMMARY OF THE INVENTION

An object of the present invention is to provide a new fabrication process of a stepped circuit board to solve the defects in the prior art.

To achieve the above object, the present invention employs the following technical solutions:

a fabrication process of a stepped circuit board is provided, comprising the following steps of:

A) cutting a circuit board substrate, printing patterns on an inner layer thereof, performing etching, stepped groove grinding, washer milling a washer between the inner layer and an outer layer, brownification and lamination processing on the inner layer, and then drilling holes on the outer layer thereof;

B) electroplating the entire circuit board substrate by depositing copper on the outer layer of the circuit board substrate with drilled holes after milling plated through holes (PTH) thereon;

C) performing pattern transfer by means of through-hole plating of the drilled holes on the circuit board substrate processed by the copper depositing and the electroplating;

D) after pattern transferring, grinding a shape of a connecting sheet (SET) on the circuit board substrate after the electroplating;

E) plugging the drilled holes to form plug holes and printing a solder mask and texts in a silk-screen manner after of forming the plug holes;

F) depositing nickel immersion gold on the entire circuit board substrate, then printing characters in a silk-screen manner, thereby forming the stepped circuit board; and G) testing and inspecting an electric performance and appearance of the stepped circuit board to fabricate a finished product of the stepped circuit board.

Preferably, a lamination washer used during the lamination processing in Step A) is a polytetrafluoroethylene (PTFE) washer.

More preferably, the drilling in Step A) is drilling all holes on the circuit board substrate once, and performing metallization on the drilled holes.

During grinding the shape of a connecting piece (SET), the tolerance of shape is +/−0.10 mm, and the solder mask is a liquid photo solder resist.

The washer is a PP washer and/or a PTFE washer.

The washer in Step A) is 0.3 mm less than a single side of a stepped groove.

In the present invention, during the fabrication of a stepped groove, a stepped groove is milled (with the washer reduced by 0.3 mm) first to prevent adhesive from flowing during lamination, and is then fabricated in the manner of laminating a high temperature resistant adhesive washer made of polytetrafluoroethylene (PTFE), thereby effectively avoiding inter-layer gaps caused by the reason that the groove is milled later.

If a stepped groove is fabricated by a method of milling a blind groove and then milling the groove after laminating, it is likely to result in inter-layer gaps at the stepped joints. As there are many micro-etching and board-grinding processes from laminating to forming, lotion is likely to be resided within the inter-layer gaps, thereby causing board delamination, open/short circuit or other problems.

During the lamination of a stepped board, a corresponding washer is generally placed in a stepped position to ensure that the stepped board is fabricated as a normal board. How to select an appropriate washer to ensure the reliability of laminating and other working procedures is a key point of research. If the thickness or size compensation of the selected washer is inappropriate, depressions or projections will be caused during the lamination.

The technical solutions employed by the present invention are as follows: a PTFE washer having a small coefficient of thermal expansion and good adhesive resistance is used as a slot washer, so that the compensated size and thickness of the washer may be controlled better, and defects such as slot depression or projection caused by inappropriate compensation of a PP washer are avoided effectively.

Based on the size of the slot, the single side of the washer is reduced by about 0.3 mm, and the thickness is consistent with that of the laminated stepped groove. During the lamination, the stepped groove will expand correspondingly. If the size of the washer is consistent with that of the slot, the internal stress of the board resulted from expansion cannot be released effectively during the lamination, so that the projection of the edge of the stepped groove will be caused. Through repeated tests, reducing the single side of the washer by 0.3 mm may effectively avoid such problem. In addition, the thickness of the washer must be consistent with that of the stepped groove after lamination, so that the laminated thickness of the stepped groove may be consistent with that of the washer. If the washer is too thick, the projection of the stepped groove will be caused; however, if the washer is too thin, the depression will be caused.

Compared with the prior art, the present invention has the following advantages and beneficial effects.

In the present invention, during the fabrication of a stepped groove, a stepped groove is milled (increased by 0.3 mm) first to prevent adhesive from flowing during lamination, and is then fabricated in the manner of laminating a high temperature resistant adhesive washer made of polytetrafluoroethylene (PTFE), thereby effectively avoiding inter-layer gaps caused by the reason that the groove is milled later. Moreover, a PTFE washer having a small coefficient of thermal expansion and good adhesive resistance is used as a slot washer in the present invention, so that the compensated size and thickness of the washer may be controlled better, and defects such as slot depression or projection caused by the inappropriate compensation of a PP washer are avoided effectively.

DETAILED DESCRIPTION OF THE PREFERRED EMBODIMENTS

The present invention will be further described as below in details by specific embodiments.

Fabrication of a Stepped Circuit Board:

1) Cutting

During cutting, it is required to measure that the thickness of a substrate to be cut is within a tolerance range, in order to ensure that the board to be cut can meet the requirements on the thickness of a laminated board.

Cutting size: 605*300 mm; and material: IT158 and RF-35.

2) Printing Patterns on the Inner Layer

L2 and L3 are printed with patterns normally, while L1 and L4 are printed with patterns only on the peripheral target positions.

3) Groove Milling

The groove milling is performed on L3. The designated slots on the L3 and L4 core boards made of IT158 and on the 0.30 mm light board are all milled. The coefficient of groove milling is identical to that of the pattern film of L3.

4) Milling a PP Washer and a PTFE Washer

The PP or PTFE washer is sandwiched between light boards 1.0 mm in thickness, and the coefficient of groove milling is identical to that of the pattern film of L3.

During milling a PTFE washer, it is required to use a new double-edged milling tool every time, adhesive coalescence and defects such as flashing on milled edges are not allowed, and rivet holes should be integral.

5) Laminating

Brownification: brownification is performed to the light boards and core boards at a rate of 3.0-3.2 m/min.

Laminating: A. hot-pressing parameters: YB parameters; kraft paper: 20 pieces of kraft paper (new) at the top and 20 pieces of kraft paper (new) at the bottom;

B. during the arrangement of boards, the milled positions are filled with the PTFE washers, the milled surface is placed upward, and aluminum sheets, silica gel washers and release films are used cooperatively;

C. the PTFE washers cannot be biased, otherwise there will be projections and depressions;

D. during the arrangement of boards, it is required to clear PP powder on the copper surface of the stepped board; and E. the number of layers of boards: five layers at most on each panel.

6) Removal of Adhesive Flowing on the Surfaces of the Boards

Remove the brown film: the brown film is removed by sand blasting (the polish-brush is not started), the boards are then immersed in 98% concentrated sulfuric acid for 5-8 min for removing adhesive flowing on the boards, and dried by a scrubbing machine before copper plating (the polish-brush is not started).

7) Drilling holes on the outer layer

A new UC-series of drilling tools are used.

The milled positions are filled with the PP washers and then covered with aluminum sheets to prevent flashing of holes at the stepped positions.

The aperture of the first board is determined to be less than 25 μm, and there is no abnormal copper, no hole flashing and no burrs in holes by inspection.

After drilling, the boards are laminated and dried at 150×3H, with no more than 15PNL once.

8) Plasma Activation

Parameters of Activation

The activation is performed with $H_2$ for 35 min.

TABLE 1

| | Parameters of plasma activation | | | | | |
|---|---|---|---|---|---|---|
| De-gumming | | Gas flow (sccm) | | | | |
| stage | $H_2$ | $N_2$ | $O_2$ | $CF_4$ | Power | Time (Min) |
| First stage | / | 160 | 1200 | 240 | 8000 | 15 |
| Second stage | 400 | 800 | / | / | 8000 | 30 |

9) PTH & Full-Board Electroplating

Depositing copper for two times: the first time of copper deposition starts from the deoiling cylinder, while the second time of copper deposition starts from the preimpregnation cylinder (chemical de-gumming dregs cannot passthrough).

Hole section: excision check is performed after board power: hole copper and surface support meet the requirement of MI; and, aperture is less than or equal to 25 μm.

10) Printing Patterns on the Outer Layer

Before pressing the film, a PTEF washer is placed in the stepped positions, the film is dried via Yin Tian BF-40 and then pressed manually via a laminator.

After developing, the high temperature resistant adhesive washer is taken out. Grinding a shape of a connecting sheet (SET) formed on the circuit board substrate.

11) Solder-Masking

The holes are plugged via core boards. The hole-plugging core boards must be adhered onto a screen, and un-full and reddish plugged holes are not allowed.

The solder mask is produced by dot-blocking screen printing, or silk-screen printing, and green-oil plugged holes are allowed to prevent printing ink from accumulating in blind grooves, and it is not allowed to use electrostatic spraying for production. The silk-screen printing produces texts.

12) Depositing Nickel Immersion Gold

Depositing nickel immersion gold on the entire circuit board substrate, and then printing characters in a silk-screen manner. The supplied materials are checked, and the holes shall be plugged fully by the solder mask. Sand blasting, but not mechanical brushing, is performed only before removing gold.

The activation is prolonged for 30 seconds. Missed plating and defects disabling gold plated of the first board are checked, and the thickness of gold and nickel is measured.

13) Forming

The milling parameters of a blend pressed board are used, and a new milling tool is used for purpose of production.

To prevent the gold surface from rubbing, each PNL is separated via a piece of white paper during milling, and it is checked that the first board has no burrs on board edges and no flash.

This flow is a flow for fabricating a four-layer stepped board. The overall fabrication idea is as follows: the patterns of inner layers are fabricated at first, then a layer on which a groove is to be fabricated are required to be ground and then are laminated together with a layer on which no groove is to be fabricated. A PTFE washer is placed at each groove, and the washer is 0.3 mm less than a single edge of the groove. During drilling, a PP washer is placed at the groove to avoid burrs and flashing of the drilled holes. After drilling, to remove the residual adhesive dregs in the holes and prevent chemical de-gumming from damaging the substrate, the chemical de-gumming method is replaced by the plasma de-gumming method.

The key points of the fabrication are Step 3, Step 4, Step 5, Step 7 and Step 8.

Step 3: It is required to grind a layer on which a groove is to be fabricated, and the size of the ground layer is consistent with a designed size.

Step 4: Washers, including a PP washer and a PTFE, are ground to be 0.33 mm less than the size of the slot. As the boards will expand (i.e., adhesive will be squeezed out) when the slot is laminated, and if the washer is not shrunk, the expansion of the groove will be impeded and the boards will be bent after laminated.

Step 5: The lamination is performed by using the designated parameters, and the PTFE washer is placed in the slot for lamination, and then is removed after lamination.

Step 7: The PP washer is placed in the slot during drilling to avoid burrs or flashes of the drilled holes, and then is removed after drilling.

Step 8: The adhesive dregs are removed by plasma activation after drilling, to prevent chemical de-gumming from damaging the substrate and to ensure good subsequent metallization of the electroplated holes.

The achieved effects are as follows: the PTFE washer shrunk by 0.3 mm is placed at the slot for lamination, so that the flatness of the slot may be ensured and the quantity of squeezed adhesive may be controller; a drilling washer may avoid burrs of the drilled holes; and, the plasma de-gumming method can ensure an appropriate de-gumming amount, does not damage the substrate, and may ensure good subsequent metallization of the electroplated holes.

The description above only illustrates the present invention with reference to specific preferred embodiments, but not be regarded as limitations to the specific embodiments of the present invention. Any simple deduction or replacement that may be made by an ordinary person skilled in the art without departing from the idea of the present invention shall fall into the protection scope thereof.

What is claimed is:

1. A fabrication process of a stepped circuit board, comprising the following steps of:
   A) cutting a circuit board substrate, printing patterns on an inner layer of the circuit board substrate, stepped groove milling of the inner layer, washer milling a washer between the inner layer and outer layer, brownification and lamination processing on the inner layer, and then drilling holes on the outer layer of the circuit board substrate;
   B) electroplating the entire circuit board substrate by depositing copper on the outer layer of the circuit board substrate with the drilled holes;
   C) performing pattern transfer by means of through-hole plating of the drilled holes on the circuit board substrate processed by the copper depositing and the electroplating;
   D) after pattern transferring, grinding a shape of a connecting sheet (SET) on the circuit board substrate after the electroplating;
   E) plugging the drilled holes to form plug holes and printing a solder mask and texts in a silk-screen manner after forming the plug holes;
   F) depositing nickel immersion gold on the entire circuit board substrate, then printing characters in a silk-screen manner, thereby forming the stepped circuit board; and
   G) testing and inspecting an electric performance and appearance of the stepped circuit board to fabricate a finished product of the stepped circuit board.

2. The fabrication process of a stepped circuit board according to claim 1, wherein a lamination washer is used during the lamination processing in Step A) and the washer is formed of polytetrafluoroethylene (PTFE).

3. The fabrication process of a stepped circuit board according to claim 1, wherein the drilling in Step A) is drilling all holes on the circuit board substrate once, and performing metallization on the drilled holes via the electroplating.

4. The fabrication process of a stepped circuit board according to claim 1, wherein the washer is a PP washer or a PTFE washer.

5. The fabrication process of a stepped circuit board according to claim 4, wherein the washer in Step A) is 0.3 mm less than a single side of a stepped groove.

* * * * *